United States Patent [19]

Miller

[11] Patent Number: 5,059,894
[45] Date of Patent: Oct. 22, 1991

[54] ELECTRO-OPTIC VOLTAGE MEASURING APPARTAUS WITH SINGLE ENDED OPTICS

[75] Inventor: Robert C. Miller, New Alexandria, Pa.

[73] Assignee: ABB Power T&D Company, Inc., Blue Bell, Pa.

[21] Appl. No.: 524,643

[22] Filed: May 16, 1990

[51] Int. Cl.$^5$ ............................................. G01R 33/032
[52] U.S. Cl. ...................................... 324/96; 359/246; 359/279
[58] Field of Search .................. 324/96; 350/356, 374, 350/376; 356/368

[56] References Cited

U.S. PATENT DOCUMENTS

| | | | |
|---|---|---|---|
| 4,629,323 | 12/1986 | Matsumoto | 324/96 |
| 4,864,222 | 9/1989 | Aoshima et al. | 324/96 |
| 4,904,931 | 2/1990 | Miller | 324/96 |

Primary Examiner—Ernest F. Karlsen
Attorney, Agent, or Firm—Richard V. Westerhoff

[57] ABSTRACT

A voltage measuring system utilizes an electro-optic voltage transducer (EOVT) in which two beams of polarized light injected into one end of an electro-optic crystal parallel to its fourfold axis of rotary inversion are reflected back through the crystal by a prism so that the optical inputs and outputs, including polarizers, collimators, optic fibers, and fractional wave plates where required, are all located at one end of the crystal, which is preferably connected to the low side of the voltage to be measured. The EOVT is supported substantially only at the end with the optical inputs and outputs, with the free end on which the prism is mounted being substantially unsupported. In one embodiment of the invention, a triangular prism is used to reflect the polarized light back through the prism, in another a pyramid prism is utilized. In the latter case, the material of the prism and, if desired, a metal coating applied to the reflecting faces of the prism, can be selected so as to produce a ¼ wave phase shift between components of the two polarized light beams parallel to the fast and slow axes, which is needed in addition to the phase shift resulting from the measured voltage for generating an unambiguous representation of voltages exceeding the halfway voltage of the electro-optic crystal, thereby eliminating the need for fractional wave plates. A partial or full metal coating on the prism can be used to electrically connect a transparent electrode located between the prism and the crystal to a conducting spring bearing against the prism for applying the voltage to be measured to the free end of the electro-optic crystal.

24 Claims, 4 Drawing Sheets

ELECTRO-OPTIC VOLTAGE MEASURING APPARTAUS WITH SINGLE ENDED OPTICS

RELATED APPLICATION

Commonly owned, concurrently filed U.S. patent application Ser. No. 524,644 filed on May 16, 1990 and entitled: An Electro-Optic Voltage Measuring System with Temperature Compensation and identified by Assignee's Docket No. ABB90-001.

BACKGROUND OF THE INVENTION

1. Field of the Invention

This invention relates to electro-optic voltage measuring apparatus in which a shift in phase of polarized light passed through a crystal exhibiting birefrigance in proportion to an applied electric field provides a measure of the voltage producing the field. More particularly, the invention relates to such apparatus having single ended optics.

2. Background Information

Electro-optical systems for measuring electric voltages are known. For instance, devices known as Pockel cells utilize certain crystals which exhibit birefringence, that is a difference in the index of refraction in two orthogonal planes, in the presence of an electric field. Some of these crystals, such as, for example, KDP (potassium dihydrogen phosphate), have a fourfold axis of rotary inversion. Such materials have the property that in the absence of an electric field the index of refraction for light propagating along the fourfold axis is independent of the plane of polarization of the light. However, if an electric field is applied parallel to the direction of the light, the index of refraction for light polarized in one direction transverse to the fourfold axis, known as the fast axis decreases and that in an orthogonal direction, also transverse to the fourfold axis, and known as the slow axis, increases by an amount which is proportional to the strength of the electric field. In such Pockel cell devices, if light is polarized in a plane which forms an angle to these transverse axes, the component of the polarized light in the direction of the slow axis with the increased index of refraction is retarded with respect to the other component. If the crystal is aligned with its fourfold axis extending between the objects between which the voltage is to be measured, and the polarized light is directed parallel to the fourfold axis, the total retardation will be proportional to the total voltage differential between the two objects. This retardation is typically measured in wavelengths. The retardation is detected in an analyzer and converted to an electrical signal for producing an output representative of the magnitude of the voltage generating the field. Due to the cylic nature of this electrical signal, the output is only unambiguous for voltages producing a retardation which is less than the halfwave voltage for the crystal. In KDP, this halfwave voltage is about 11300 volts.

One application for electro-optic voltage measuring systems is in measuring the voltages of several hundred thousand volts in electric power transmission and distribution systems. Obviously, devices which can only measure voltages up to a halfwave voltage of a little more than 10,000 volts are not suitable for this purpose. U.S. Pat. No. 4,904,931 discloses an electro-optic voltage measuring system in which two polarized beams of light are passed through an electro-optic crystal having a fourfold axis of rotary inversion extending between electrodes carrying the voltage to be measured. The components parallel to the fast and slow axes of each of the polarized beams of light are shifted in phase in proportion to the magnitude of the applied voltage. In addition, the components of one of these polarized beams are additionally retarded with respect to the components of the other polarized light beam by a ¼ wave plate, or by two ⅛ wave plates with their axes rotated 90° with respect to each other, one in the path of each polarized beam. These two polarized light beams with a difference in phase of ¼ wave between their respective fast and slow components, are converted into a pair of electrical signals in quadrature. A digital computer calculates from these quadrature electrical signals an unambiguous representation of the instantaneous values of applied voltages including voltages in excess of the halfwave voltage of the crystal.

In the voltage measuring system described in U.S. Pat. No. 4,904,931, the electro-optical crystal is electrically connected at opposite ends to the points between which the voltage is to be measured, for instance between a transmission line and ground. The polarized light is injected into one end of the crystal and analyzed at the other end. Thus, optic fibers are connected to both ends of the crystal. The fibers connected to one end of the crystal must therefore pass from a region at line voltage to ground when the line to ground voltage is to be measured. Because of the limited space available, this is difficult to accomplish without affecting the integrity of the insulation. Furthermore, the electro-optic voltage transducer of U.S. Pat. No. 4,904,931, the electro-optic crystal is supported at both ends.

It is an overall object of the present invention to provide an improved electro-optic voltage transducer.

It is a primary object of the invention to provide such an improved electro-optic voltage transducer in which optic fibers do not have to extend between regions of high voltage differential.

It is a particular object of the invention to provide such an improved electro-optic transducer for measuring a voltage to ground in which all the optic fibers are connected in regions at ground potential.

It is also an object of the invention to provide an electro-optic voltage transducer of the type in which the voltage to be measured is applied to opposite ends of an electro-optic crystal, but in which the crystal is only supported at one end.

It is another object of the invention to provide such a transducer in which the optic fibers are all connected to the one supported end of the electro-optic crystal.

It is yet another overall object of the invention to provide such a transducer which is easier to manufacture and assemble than present transducers and has better electrical isolation.

SUMMARY OF THE INVENTION

These and other objects are realized by the invention which is directed to apparatus for measuring voltage utilizing an electro-optic crystal with a fourfold axis rotary inversion in which polarized light is passed longitudinally through the crystal in one direction and then redirected back through the crystal in the opposite direction.

This arrangement has several advantages. All of the light inputs and outputs to the electro-optic crystal are at one end which is preferably the end to which the lower side of the voltage to be measured is applied to the electro-optic crystal, such as ground when measuring a line to ground voltage. This greatly reduces the insulation requirements of the optic fibers transmitting the light to and from the crystal.

In addition, redirecting the light back through the crystal produces twice the retardation for a given voltage, thereby increasing the sensitivity of the transducer. Furthermore, with all of the light inputs and outputs, including optic fibers, collimators, polarizers and fractional wave plates where required, located at one end of the electro-optic crystal, the crystal can be substantially supported only at that one end, thereby reducing the mechanical stresses encountered in such crystals supported at both ends.

The invention is applicable to single beam voltage measuring systems as well as systems in which two beams of polarized light are passed through the electro-optic crystal.

In one embodiment of the invention, the device for redirecting the polarized light back through the crystal is a triangular prism which is mounted with its base facing the electro-optic crystal and its two reflecting faces parallel to either the fast or slow axis in the electro-optic crystal. The light is polarized in a plane which is at a selected angles, preferably substantially 45°, to the fast and slow axes of the electro-optic crystal.

In a second embodiment of the invention, the reflecting device is a pyramid prism having four reflecting faces two of which are parallel to the fast axis and two of which are parallel to the slow axis of the electro-optic crystal. The two polarized light beams are each reflected by a pair of diagonally opposite reflecting faces in the pyramid prism. Since different components parallel to the fast and slow axes of the electro-optic crystal are parallel to the reflecting faces of the prism for each of the two beams, there is a relative phase shift between the components of the two light beams caused by the pyramid prism. By selection of a prism with an appropriate index of refraction, this relative phase shift can be made to be about the $\frac{1}{4}$ wave shift desired for a two channel system thereby eliminating the need for fractional wave plates. This $\frac{1}{4}$ wave phase shift between corresponding components of the two light beams parallel to the fast and slow axes is, in addition to the relative retardation between these components in each beam, caused by the voltage to be measured and which is the same for both beams.

As another feature of the invention, the prism mounted on the free end of the electro-optic crystal can be provided with a metal coating in electrical contact with a transparent electrode between the end of the crystal and the prism for applying the voltage to be measured to the second end of the crystal through a flexible conductor such as a spring which bears against the metal coating on the prism. The metal coating can be applied to the prism so that the reflecting surfaces are uncoated, or alternatively, fully coated. In the latter case, the metal coating and the material for the pyramid prism can be selected to produce the desired $\frac{1}{4}$ wave relative phase shift between the components of the two polarized light beams.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
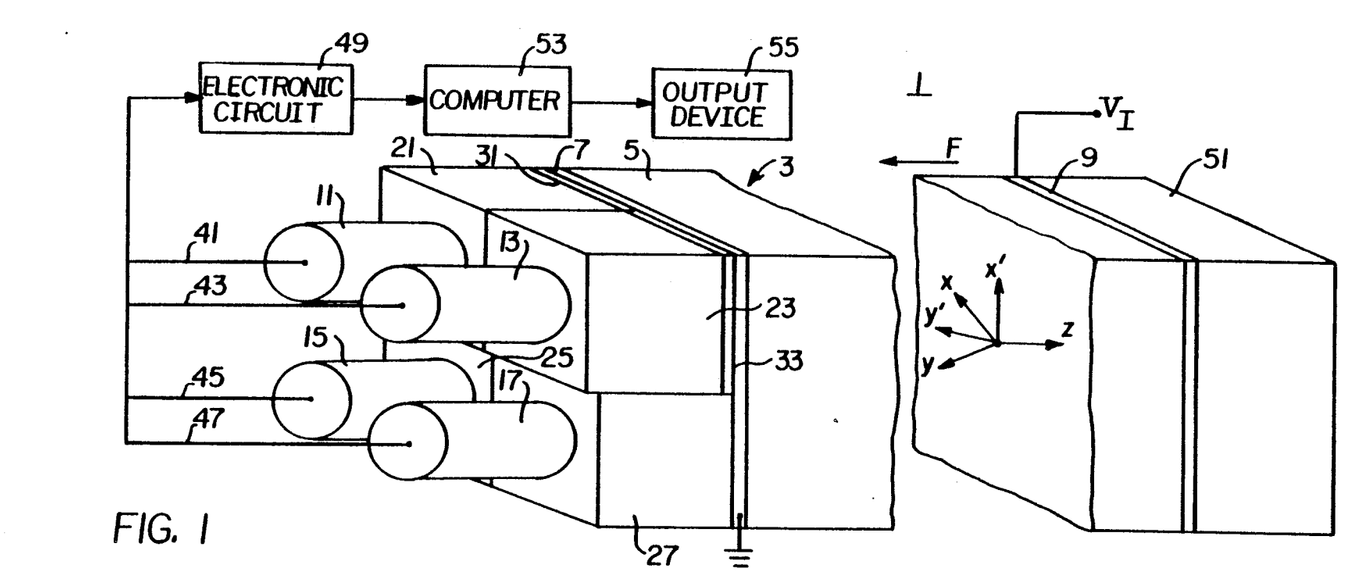
FIG. 1 is a schematic diagram with portions cut away of voltage measuring apparatus in accordance with the invention.

FIG. 1 illustrates schematically a voltage measuring system 1 in accordance with the invention. The voltage measuring system 1 incorporates an electro-optical voltage transducer (EOVT) 3. The EOVT 3 utilizes an electro-optic crystal 5 having a fourfold axis of rotary inversion, Z, oriented longitudinally in the crystal shown in FIG. 1. The crystal 5 also has a fast axis and a slow axis, one of which extends in the X' direction and the other in the Y' direction. These fast and slow axes are mutually orthogonal with the fourfold axis of rotary inversion Z.

The voltage to be measured, for instance $V_l$ to ground, is applied to transparent electrodes 7 and 9 at the opposite ends of the crystal 5 such that the field F generated by the voltage is parallel to the fourfold axis of rotary inversion extending in the Z direction. In accordance with the principles of the voltage measuring system of U.S. Pat. No. 4,904,931, two beams of polarized collimated light are passed through the electro-optical crystal 5. As will become apparent, the invention is also applicable to electro-optical voltage measuring systems in which only one beam of light is passed through the electro-optic crystal.

Unlike the electro-optic transducer of U.S. Pat. No. 4,904,931, where two beams of light are injected at one end of the crystal and analyzed as they emerge from the opposite end of the crystal, in the present invention, the light is injected into and analyzed at a single end of the crystal 5. For injecting light into and analyzing light passed through the crystal, the EOVT 3 includes four collimators 11, 13, 15, and 17, four polarizers 21, 23, 25 and 27 and two $\frac{1}{4}$ wave plates 31 and 33. The collimators are connected by optic fibers 41, 43, 45, and 47 to an electronic circuit 49. The electronic circuit 49 is fully described in U.S. Pat. No. 4,904,931 which is hereby incorporated by reference.

In the present invention, the two light beams injected into the crystal 5 pass lengthwise through the crystal and are reflected back through a parallel path by a reflecting device 51 at the opposite end of the electro-optic crystal. The two beams of light each may be injected and reflected along laterally adjacent paths, or diagonally opposite paths through the electro-optic crystal 5. Thus, for instance, light generated by LEDs in the electronic circuit 49 can be transmitted through optic fibers 41 and 45, collimated by collimators 11 and 15, and polarized by the polarizers 21 and 25, respectively. Light from the optic fiber 41 is also passed through the ⅛ wave plate 31 before both beams of light pass through the transparent electrode 7 and into the crystal 5. The two light beams pass through the crystal 5 and electrode 9 and are reflected back by the reflecting device 51 along paths which direct the beam carried by optic fiber 41 back through the electrode 9, the crystal 5, the electrode 7, ⅛ wave plate 33 polarizer 23 and into collimator 13 which collimates the light for transmission by the optic fiber 43 back to the electronic circuit 49. Similarly, the beam transmitted by optic fiber 45 passes back through the electrode 9, crystal 5, and electrode 7, is analyzed by polarizer 27 and collimated by collimator 17 for return to the electronic circuit 49 through the optic fiber 47.

In another embodiment of the invention also to be disclosed in detail, light carried by the optic fiber 41 is returned through optic fiber 47, and light carried by the optic fiber 45 is returned through optic fiber 43.

Whichever pattern of light transmission is utilized, the input polarizers polarize the light in a plane which is at a 45° angle to both the fast and slow axes of the electro-optic crystal 5. The input polarizers polarize the collimated light in the plane of either the X or Y axis as shown in FIG. 1. The ⅛ wave plates 31 and 33 are oriented to produce a relative phase shift of ¼ wave between the fast and slow axis components of the two light beams passed through the electro-optic crystal 5. As will be discussed, in some embodiments of the invention, these ⅛ wave plates are not necessary as the ¼ wave relative phase difference between the fast and slow axis components of the two light beams passed through the crystal is effected by the reflecting device 51.

As fully explained in U.S. Pat. No. 4,904,931, the electronic circuit 49 converts the light signals which have passed through the crystal into two electrical signals in quadrature. These two analog electrical signals are digitized for input to a digital computer 53 which calculates the instantaneous magnitude of the input voltage, $V_I$, from the quadrature electrical signals for presentation on an output device 55, such as for instance, a cathode ray tube.

Figure 2:
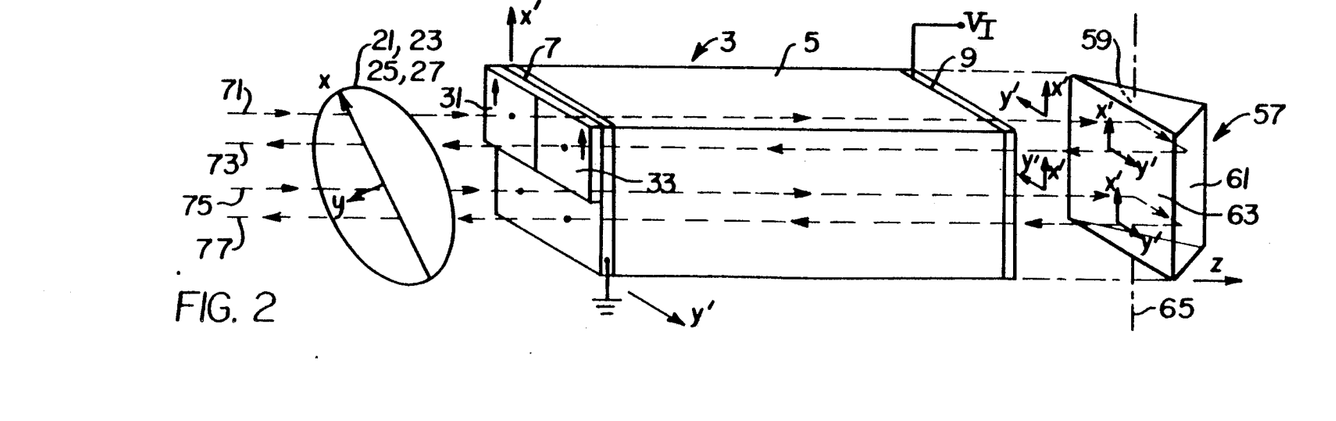
FIG. 2 is an isometric drawing schematically illustrating operation of one embodiment of the invention.

FIG. 2 illustrates schematically the operation of one embodiment of the invention in which the reflecting device is a triangular prism 57. The triangular prism 57 has two reflecting faces 59 and 61 which intersect at a 90° angle and a base face 63 which intersects each of the reflecting faces 59 and 61 at a 45° angle. The base face 63 faces the end of the electro-optic crystal 5 with the longitudinal axis 65 of the prism 57 parallel to the fast or slow axis, either X' or Y', of the electro-optic crystal 5.

In the EOVT 3 shown in FIG. 2, a first light beam 71 is injected into the upper left hand quadrant of the electro-optical crystal 5 as seen from the end adjacent the electrode 7 and is returned along the path 73 in the upper right hand quadrant of the crystal. The second beam is injected along the path 75 extending through the lower left hand quadrant of the crystal 5 and is returned along the path 77 in the lower right hand quadrant.

The light beams projected along the paths 71 and 75 are polarized by the polarizers 21 and 23, respectively, in a plane extending along the X axis which, as explained, is oriented at a 45° angle to the fast and slow axes of the electro-optic crystal 5, either of which may be X' or Y'. The two light beams polarized in the X plane can be resolved into components along the X' axis and Y' axis. The light traveling along the path 71 emerges from the electro-optic crystal 5 and passes into the prism 57 where it is reflected by the reflecting surface 59 at a right angle to the reflecting surface 61 which reflects it along the path 73 back through the electro-optic crystal 5. Similarly, the light projected along path 75 is reflected by the reflecting surfaces 59 and 61 back through the crystal along the path 77.

As seen in FIG. 2, the X' component of light traveling along path 71 is parallel to the longitudinal axis 65 of the prism 57 and therefore lies in the plane of the reflecting surface 59 so that it is reflected to the reflecting face 61 without change in orientation. This X' component also lies in the plane of the face 61 and, hence, is reflected back along the path 73 in the same orientation that it had in the path 71. On the other hand, the Y' component of the light traveling along the path 71 is perpendicular to the plane of both reflecting faces 59 and 61 of the prism 57 so that it is shifted in direction by 180° by the prism 57. However, it will be noted from FIG. 2 that the component of light which is parallel to the fast axis of the crystal on the path 71 remains parallel to that axis on the return path 73, and that the component parallel to the slow axis remains parallel to the slow axis. While the component parallel to the Y' axis, which may be either the fast or slow axis, has reversed 180°, it remains parallel to that axis and hence will be again either advanced or retarded with respect to the X' component on the return path through the crystal. Thus, where the retardation along the path 71 through the crystal is Γ, the total retardation of the component parallel to the slow axis compared to the component parallel to the fast axis is 2Γ. There is some change in phase produced by the reflecting faces 59 and 61 of the prism, however, since each of the beams is incident upon these reflecting faces at the same angles, there is no relative change in phase between the two beams produced by reflection.

Figures 3, 4, 5:
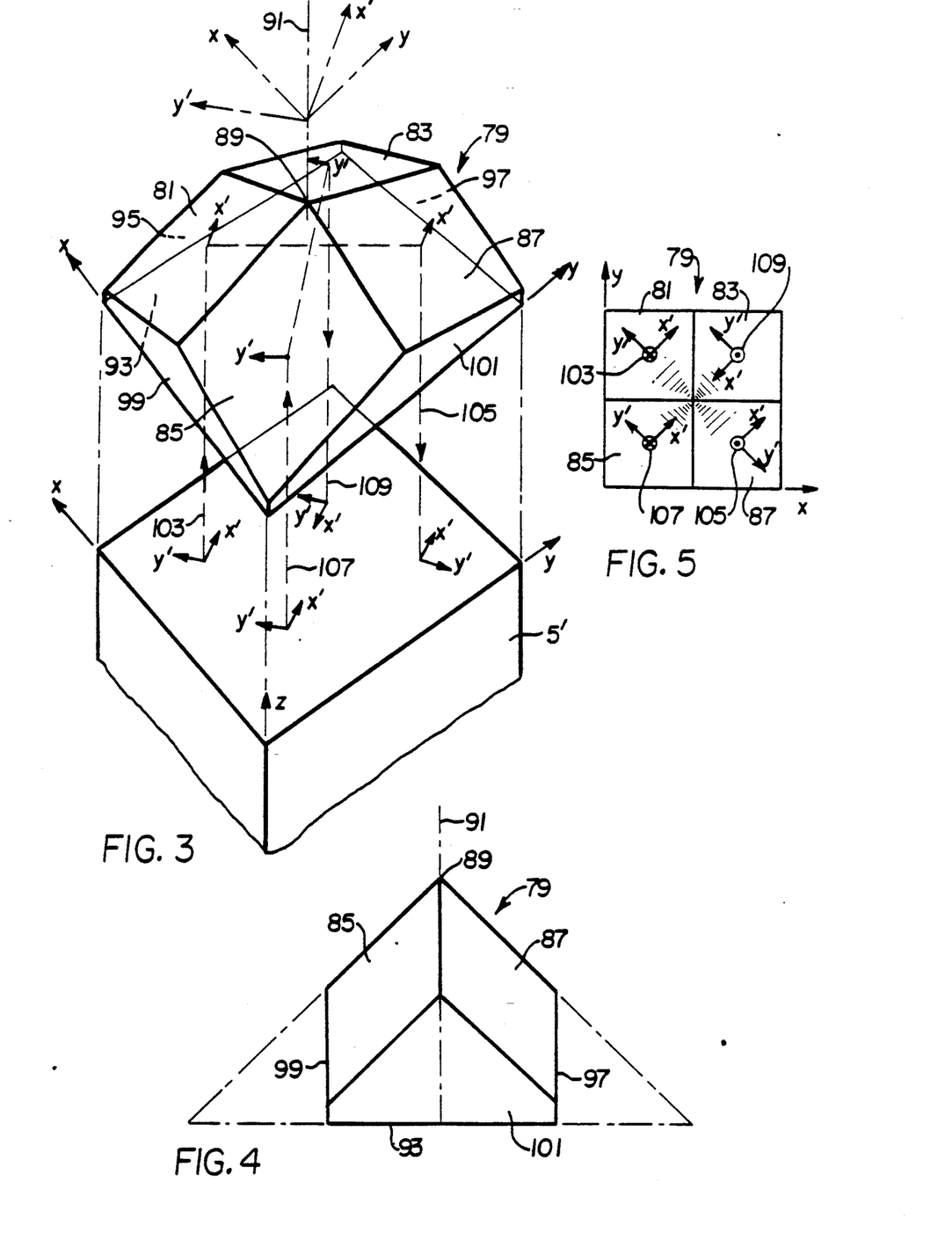
FIG. 3 is an exploded isometric view of a portion of an electro-optic crystal and a reflecting device which form a part of another embodiment of the invention.
FIG. 4 is a side elevation view of the reflecting device shown in FIG. 3 illustrating in phantom lines fabrication of the reflecting device from a four sided pyramid prism.
FIG. 5 is a bottom plan view of the reflecting device shown in FIGS. 3 and 4.

In a second embodiment of the invention, the reflecting device is a four sided pyramid prism. An isometric view of this pyramid prism 79 is shown in FIG. 3, while FIG. 4 is a side elevation view and FIG. 5 is a bottom plan view of the modified reflecting device. The prism 79 has four reflecting faces 81, 83, 85 and 87 which meet at the apex 89 and which all intersect the longitudinal axis 91 of the prism at 45°. Opposite reflecting faces 81, 87 and 83, 85 are oriented at 90° to one another. The prism 79 is mounted on the electro-optic crystal 5' with a base face 93 facing the end of the crystal so that the axis 91 of the pyramid prism is parallel to the Z axis of the crystal. In this embodiment of the invention, the fast and slow axes X' and Y' are oriented along the diagonals of the electro-optic crystal 5'. The corners of the pyramid are trimmed off as shown in phantom in FIG.

4 leaving vertical faces 95, 97, 99 and 101. The pyramid is rotated about the vertical axis 91 so that these vertical surfaces 95, 97, 99 and 101 are parallel to the sides of the rectangular electro-optic crystal 5 extending in the planes X and Y, as shown in FIGS. 3 and 5.

In this embodiment of the invention, light transmitted by optic fiber 41 is injected along a path 103 and returned along a path 105 to the diagonally opposite optic fiber 47 (see FIG. 1). The second beam of light transmitted by optic fiber 45 is projected along path 107 and returned along path 109 to optic fiber 43. The polarizers 21 and 25 polarize the two beams of light injected into the electro-optic crystal 5 in planes which are parallel to either the X or Y axis, which in this instance is parallel to one of the sides of the rectangular crystal. Again, this polarized light may be resolved into two components parallel to the fast and slow axes, X' and Y'. The path 103 of the first beam of light is aligned with the reflecting face 81 of the prism 79. Light traveling along the path 103 enters through the bottom face 93 of the prism and intersects the reflecting face 81 with the X' component parallel to the reflecting face 81 and the Y' component perpendicular to this reflecting surface. The beam is reflected by the reflecting face 81 to the reflecting face 87, again with the component X' in the plane of the face 87 and the Y' component perpendicular to this reflecting face. This first light beam is then reflected back into the crystal along the path 105 with the X' component oriented the same as in the path 103 and the Y' component still oriented along the Y' axis but extending in the opposite direction.

Light emerging from the crystal 5' along the path 107 intersects the reflecting face 85 of the prism 79 with the Y' component parallel to this reflecting face and the X' component perpendicular to it. This second beam of light is reflected to the reflecting face 83 again with the Y' component in the plane of the reflecting face 83 and the X' component perpendicular to this face. The reflecting face 83 reflects the second beam of light back into the crystal 5' along the path 109 with the Y' component in the same orientation and the X' component extending along the same axis but in the opposite direction.

Light passing through the electro-optical crystal 5 and reflected back through the reflecting prisms 57 and 79 is not only subject to a relative phase shift between components parallel to the fast and slow axes due to the birefringence of the crystal, but there is also a phase shift caused by each reflection of the light beam in the prisms 57 and 79. In the case of the triangular prism 57 where the components of the two light beams strike the same reflecting surfaces at the same angles, the relative phase shift due to reflection is the same for the components of both beams. However, in the case of the pyramid prism 79, the phase shifts of the components of the two beams of light due to reflection are in opposite directions. Thus, the total phase shift for the components of the first beam is as follows:

$$\Gamma_{T2} = 2\Gamma + 2\delta \qquad (1)$$

and for the second beam:

$$\Gamma_{T2} = 2\Gamma - 2\delta \qquad (2)$$

where $\Gamma_{T1}$ and $\Gamma_{T2}$ are the total retardations for the components of the first and second beams, $\Gamma$ is the retardation due to birefringence in the crystal for passage of the components of the light beam in each direction and $\delta$ is the retardation due to reflection. As can be seen from equations 1 and 2, the difference in total retardation between the components of beams 1 and 2 is $4\delta$.

The relative retardation between the component of the light parallel to the reflecting surface and the component perpendicular to the reflecting surface where the angle of incidence is 45° and the reflecting surface is exposed to air, is as follows:

$$\delta = 2 \tan^{-1}\left(\frac{\sqrt{n^2 - 2}}{n}\right) \qquad \text{Eq. (3)}$$

where n is the index of refraction of the prism.

Figure 6:
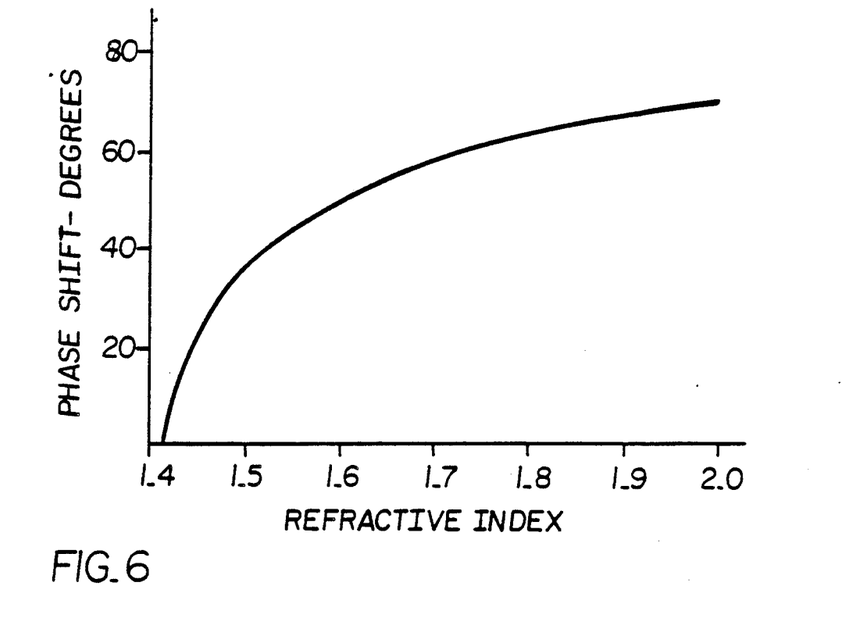
FIG. 6 is a plot illustrating the relationship of phase shift due to reflection to the refractive index of the reflecting devices in accordance with the invention.

FIG. 6 is a plot of the relative phase shift $\delta$ between the component to the reflecting surface and the refractive index of the prism for an angle of incidence of 45° and with the reflecting face of the prism exposed to air. The total relative phase shift for the components of the two light beams resulting from the double reflection by the prism is added to the relative phase shift produced by the fractional wave plates 31 and 33 to produce the desired total relative phase shift of ¼ wave needed to place the two electrical signals generated from the light beams emerging from the crystal in quadrature. The wave plates 31 and 33 in this instance should be selected to provide the fractional phase shift required to produce a total shift of ¼ wave. It should be noted that if these fractional wave plates remain in the positions shown in FIG. 1 so that each of the two beams passes through only one of them, their axes should be set at 90° to one another to provide the desired cumulative effect.

It is a feature of this invention that by choosing a material for the pyramid prism 79 with an appropriate index of refraction, that the wave plates 31 and 33 can be eliminated. In particular, by reference to FIG. 6, it can be seen if the prism 79 has an index of refraction of 1.443 the phase shift $\delta$ will be 22.5°. Thus, $4\delta$ is 90°, the required ¼ wave shift in phase. However, a suitable glass with such an index of refraction is not readily available, and, in any event as can be seen in FIG. 6, the gradient of the phase shift in this region is rather steep. On the other hand, the trace in FIG. 6 has a much shallower gradient in the area of a refractive index of 1.901 which produces a phase shift $\delta$ of 67½°, so that $4\delta$ is 270° resulting in the desired ¼ wave relative phase shift between the two beams. For 850 nm light LaSFN18 Schott glass available from Schott Optical Glass, Inc. of Duryea, Pa. has a suitable index of refraction of 1.892. The error caused by the small difference in the desired and actual index of refraction is very small, and as can be seen, the curve of FIG. 6 in any event is relatively flat in this area.

Figure 7:
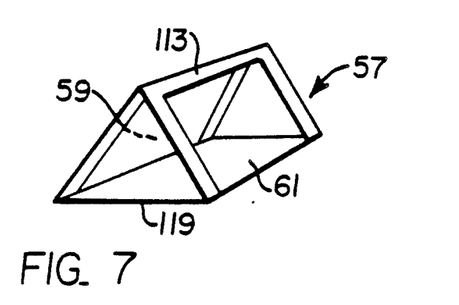
FIG. 7 is an isometric view of one embodiment of a reflective device in accordance with the invention partially covered with a conductive metal coating.
Figure 8:
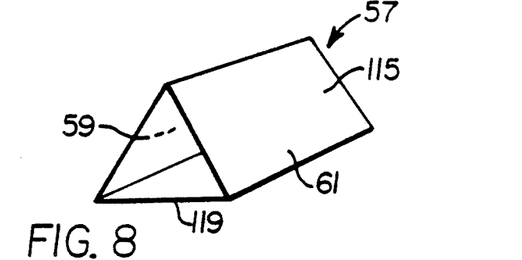
FIG. 8 is an isometric view of the embodiment of the reflecting device shown in FIG. 7 with the reflecting faces fully coated with metal.

As shown in FIGS. 7 and 8 the triangular prism 57 may be coated with a metal conductor for applying the voltage to be measured to the transparent electrode 9, (see FIG. 1). In the configuration of FIG. 7, the metal coating 113 extends only along the edges of the reflecting surfaces 59 and 61 and does not cover the portions of these reflecting surfaces at which the light beams are reflected back into the electro-optic crystal. Thus, the metal coating serves only as an electrical conductor and does not affect the phase shift of the reflected light beams. In the configuration of FIG. 8, the entire reflecting surfaces 59 and 61 are coated with the conducting metal 115. As is known, this coating affects the reflection coefficients for the perpendicular and parallel components of each reflected light beam such that the intensities of the two components are no longer equal. This effect produces a slight error in the calculated voltage which is manifested by slight discontinuity in the waveform produced. However, this slight error generally can be tolerated, or could be eliminated such as by slight adjustment of the angles of the polarizers. The phase shift and reflection coefficients associated with light reflected by a reflective surface with a metallic coating are readily calculated.

Figure 9:
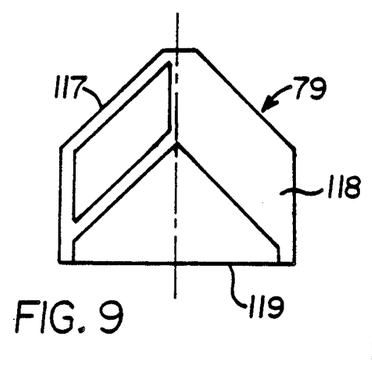
FIG. 9 is a composite side elevation view illustrating the reflecting device as shown in FIG. 4 partially coated with a conducting metal on the left side and full coated in the right half of the figure.

FIG. 9 illustrates in the left half of the figure that a partial metal coating 117 can be provided on the pyramid prism 79 to serve as a conductor for applying the voltage to the electrode on the crystal. As in the case of the prism 57, the reflecting surfaces of the pyramid 79 can be fully coated with a metal conductor 118 as illustrated in the right half of FIG. 9.

For a prism made of barium fluoride having an index of refraction of 1.475, the phase shift of 850 nm light, having an angle of incidence of 45° is $-20.3°$ for a coating of gold, $-23.4°$ for silver and $-22.4°$ for copper, for instance. Under similar conditions, but with a prism having an index of refraction of 1.63, $\delta$ for silver is $-22.5°$, so that the desired $\frac{1}{4}$ wave phase shift between the fast and slow components of the two beams is produced in the pyramid prism without the need for the wave plates 31 and 33. The use of a full metal coating not only provides means of connecting the voltage to be measured to the electrode at the end of the opto-electric crystal, but also provides a consistent phase shift which can, in the case of the pyramid prism, be properly selected to eliminate the need for fractional wave plates. On the other hand, uncoated reflecting surfaces are subject to accumulating dirt which could affect $\delta$, although as will be seen, the EOVT is mounted inside a sealed housing.

As an option, the transparent electrode 119 can be applied to the base face of the prism 57 or 79 where it is in electrical contact with the metal coating 113, 115, 117 or 118. This electrode 119, which may be indium tin oxide (ITO), may be applied directly to the prism or applied to a substrate which is secured to the prism 57 or 79 by an optical cement.

Figure 10:
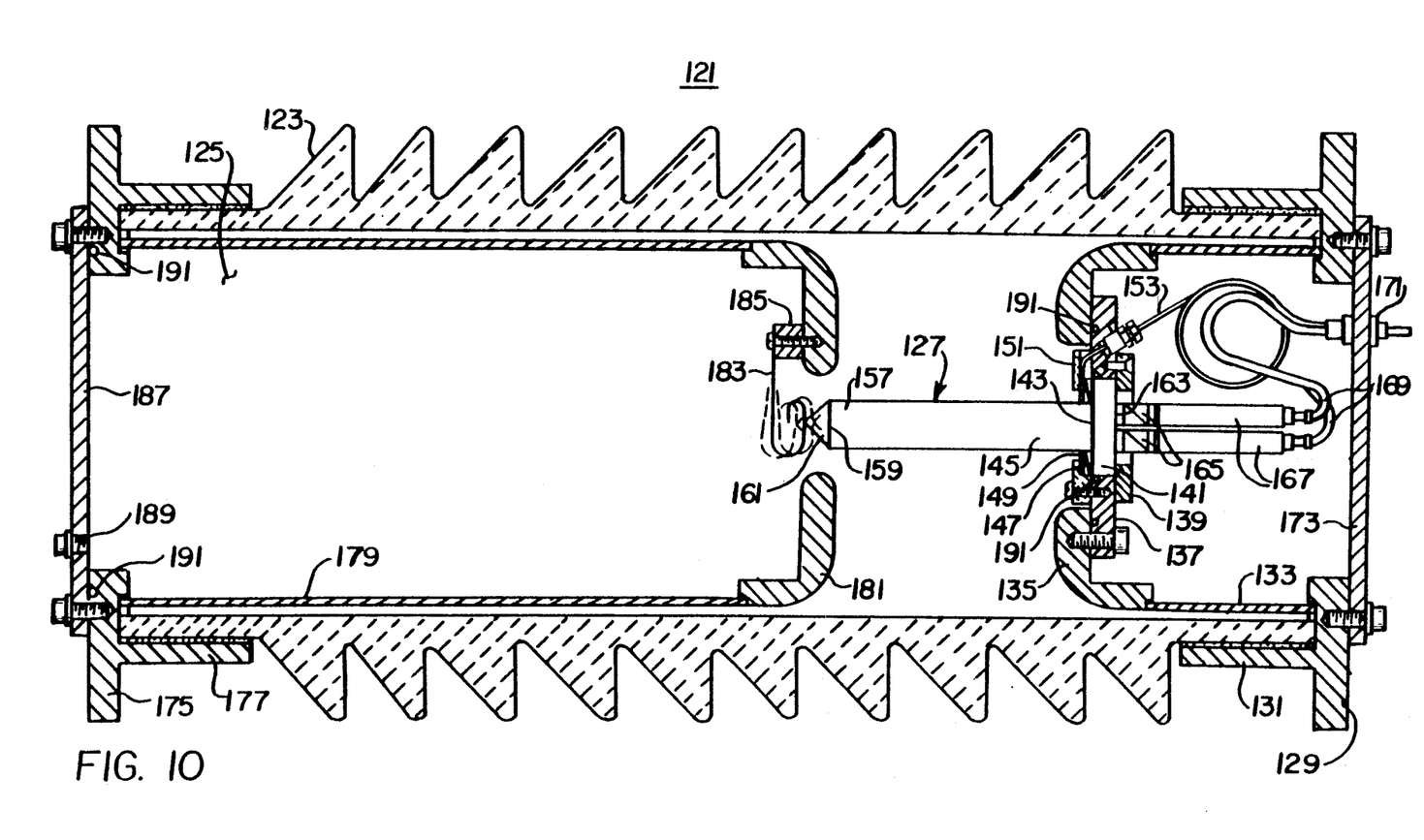
FIG. 10 is a longitudinal section view through a practical embodiment of an electro-optic voltage transducer which forms part of the voltage measuring system of the invention.
Figure 11:
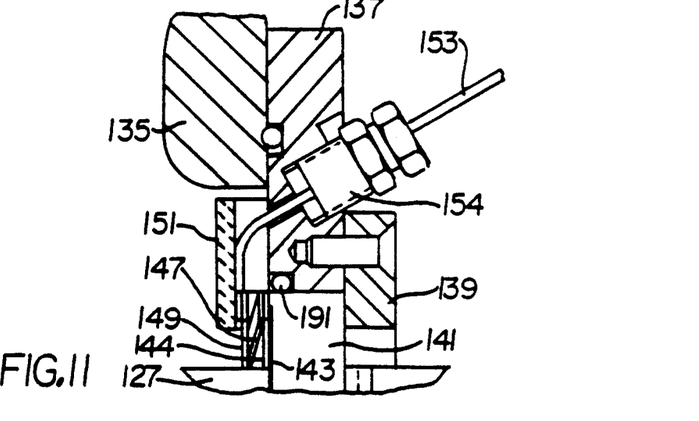
FIG. 11 is a fragmentary view in enlarged scale of a portion of the electro-optic transducer of FIG. 10.

FIG. 10 illustrates a practical embodiment of an EOVT 3 in accordance with the invention. The exemplary EOVT 121 includes a cylindrical ceramic insulator 123 which forms a housing having a cavity 125 in which an electro-optic crystal 127 is mounted. An annular end plate 129 has an axially extending cylindrical flange 131 which is cemented to one end of the ceramic insulator 123. A cylindrical, electrically conductive sleeve 133 welded to the end plate 129 extends into the cavity 125 and supports an annular electrically conductive shield ring 135 welded to the sleeve 133. An annular optics base plate 137 is bolted to the shield ring 135 with a smaller annular backing plate 139 concentrically bolted thereto forming a radial flange against which is seated a transparent circular support 141. A coating of indium tin oxide (ITO) 143 on the transparent support 141 forms one electrode for the EOVT 121. One end 145 of the electro-optic crystal 127 is cemented to the ITO layer 143 on the transparent support 141. An electrically conductive wave spring 147 is compressed between a gold ring 144 bonded to the ITO layer 143 and a shim 149 by an annular electrically insulating spring plate 151 which is bolted to the optics base plate 137. A stripped end of an insulated electrical lead 153 is clamped between the spring plate 151 and the shim 149 to provide an electric connection to the ITO electrode 143. The insulated lead 153 is supported by a fitting 154 threaded into the optics base plate 137.

The electro-optic crystal 127 is mounted with its fourfold axis of rotary inversion extending longitudinally along the cavity 125. A second substantially free end 157 of the electro-optic crystal 127 is provided with another electrode layer 159. A reflecting prism 161 is mounted on the substantially free end of the electro-optic crystal 127 by an optical cement.

Secured by optical cement to the transparent support 141 are fractional wave plates 163, if required, four polarizers 165 (only two visible in FIG. 10), four collimators 167 (two visible) and four optic fibers 169 (again only two visible). Each of the optic fibers 169 passes through a fitting 171 (only one visible) in a cover plate 173 bolted to the end plate 129. The electric lead 153 also passes through a fitting (not shown) in the cover plate 173.

A second annular end plate 175 has an axially extending cylindrical flange 177 which is cemented to the opposite end of the ceramic insulator 123. A second electrically conductive cylindrical sleeve 179 is welded to the annular end plate 175 and extends axially into the cavity 125 to support a second annular shield ring 181 adjacent the substantially free end 157 of the electro-optic crystal 127. An electrically conductive spring 183 bolted to the shield ring 181 with a spacer 185 bears against the reflecting prism 161 which is either partially or fully coated with metal as previously discussed to provide an electrical connection to the upper electrode 159. A second cover plate 187 bolted to the second end plate 175 encloses the cavity 125. Preferably, a high dielectric strength gas such as $SF_6$ is introduced into the cavity 125 such as through a plugged opening 189 in the upper cover plate 187. O-rings 191 between the end plate 175 and cover plate 187, and between optic base plate 137 and shield ring 135 and transparent support 141, seal the cavity 125 to maintain the dielectric gas under pressure to reduce the likelihood of arcing.

By supporting the electric-optic 127 at the one end 145, the crystal is free to expand and contract with temperature variations without being subject to undue mechanical stress. In addition, the shield rings 135 and 181 help to reduce fringing of the field produced by the voltage applied to the electro-optic crystal 127. This voltage to be measured is applied to the upper electrode 159 through the end plate 175, sleeve 179, shield ring 181, spacer 185, spring 183 and the coating on the reflecting prism 161. Voltage on the other electrode 143 is applied through the wave spring 147 shim 149 and electrical lead 153. It is preferred that the lower electrode 143 is connected to the low side of the voltage to be measured. Thus, when a line to ground voltage is to be measured, the electrical lead 153 is connected to ground. The end plate 129 and therefore the sleeve 133 and shield ring 135 are connected to the same potential as the lower electrode 143. With this arrangement, the optical connections are all made in regions of low potential. This reduces the insulation requirements imposed the optic fibers. This advantage is achieved while reducing the mechanical stresses applied to the electro-optic crystal.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. Apparatus for measuring a voltage between a first conducting object at a low electrical potential and a spaced apart second conducting object at a high electrical potential, said apparatus comprising:

an electro-optic crystal having a fourfold axis or rotary inversion extending between a first end of said electro-optic crystal electrically connected to said first conducting object and a second end of said electro-optical crystal electrically connected to said second conducting object, said electro-optic crystal also having a fast axis and a slow axis each perpendicular to said fourfold axis of rotary inversion and to each other;

input means injecting into one of said first and second ends of said electro-optical crystal light which is polarized in a plane intersecting said fast and slow axes at selected angles and which passes through said electro-optical crystal parallel to said fourfold axis of rotary inversion and exits at the other end of said electro-optical crystal;

redirecting means adjacent said other end of said electro-optic crystal directing said polarized light exiting said second end of said electro-optic crystal back into said electro-optic crystal at said other end with the plane of polarization at said selected angles to the fast and slow axes to pass back through said electro-optic crystal parallel to said fourfold axis of rotary inversion and exit said one end of electro-optic crystal; and conversion means, including means adjacent said one end of said electro-optic crystal, converting polarized light exiting said one end of said electro-optic crystal, into a signal representative of the voltage between the first and second conducting objects.

2. The apparatus of claim 1 including means supporting said electro-optic crystal from said one end of said crystal with said other end being substantially unsupported, wherein said redirecting means is mounted on and supported by said substantially unsupported other end of said electro-optic crystal, and including flexible conductor means electrically connecting said other end of said electro-optic crystal to one of said conducting objects.

3. The apparatus of claim 2 wherein said redirecting means is a triangular prism having two reflecting faces making an internal angle of 90° and a base face making 45° angles with each of said reflecting faces, said reflecting faces and base face all being parallel to a longitudinal axis, said triangular prism being mounted on the second end of said electro-optic crystal with said base facing said second end of said electro-optic crystal and with said longitudinal axis parallel to one of said fast and slow axes.

4. The apparatus of claim 3 wherein said reflecting faces of said triangular prism are coated with metal.

5. The apparatus of claim 3 including a transparent electrode member between said base face of said triangular prism and said second end of said electro-optic crystal and at least a partial metal coating on said prism in electrical contact with said electrode member, said flexible conductor means electrically contacting said metal coating on said prism.

6. The apparatus of claim 5 wherein said metal coating on said triangular prism does not cover portions of said reflecting faces of said prism which reflect said polarized light back through said electro-optic crystal.

7. The apparatus of claim 5 wherein said metal coating covers portions of the reflecting faces of said triangular prism which reflect said polarized light back through said triangular prism.

8. The apparatus of claim 5 wherein said flexible conductor is a spring bearing against said metal coating.

9. The apparatus of claim 5 wherein said electrode member is a transparent electrically conducting coating on said base face.

10. The apparatus of claim 1 wherein said input means injects into said one end of said electro-optic crystal two beams of polarized light which are both polarized in planes at selected angles to said fast and slow axes of said electro-optic crystal and which each pass through said electro-optic crystal parallel to said fourfold axis of rotary inversion and exit at said other end of said electro-optic crystal, wherein said redirecting means directs each of said two beams of polarized light exiting said other end of said crystal back into said other end of said electro-optic crystal with the planes of polarization at said selected angles to both said fast and slow axes of said crystal to each pass back through said electro-optic crystal parallel to said fourfold axis of rotary inversion and exit said one end of said electro-optic crystal, said apparatus further including phase shifting means shifting the relative phase between components of said two beams of polarized light parallel to said fast and slow axes, and wherein said conversion means converts said two beams of polarized light exiting said one end of said electro-optic crystal into said signal representative of the voltage between said two conducting objects.

11. The apparatus of claim 10 wherein said redirecting means is a triangular prism having two reflecting faces making an internal angle of 90° with each other and a base face making angles of 45° with each of said reflecting faces, said reflecting faces and base face all being parallel to a longitudinal axis, said triangular prism being oriented with said base face facing said second end of said electro-optic crystal and with said longitudinal axis parallel to one of said fast and slow axes.

12. The apparatus of claim 11 wherein said reflecting faces of said triangular prism are coated with a metal.

13. The apparatus of claim 11 including means supporting said electro-optic crystal at said one end with said second end substantially unsupported, said triangular prism being mounted on and supported by said second end or said electro-optic crystal, and including flexible conductor means electrically connecting said second end of said electro-optic crystal with said second conducting object.

14. The apparatus of claim 13 including a transparent electrode coating on the base face of said triangular prism and with a metallic coating on said reflecting faces of said triangular prism in electrical contact with said electrode coating, said flexible conductor electrically contacting said metal coating to apply the voltage on said second conducting object to said second end of said electro-optic crystal.

15. The apparatus of claim 10 wherein said two beams of polarized light are polarized at selected angles of substantially 45° to the fast and slow axes of said electro-optic crystal and wherein said redirecting means comprises a four sided pyramid prism having four reflecting faces each making an angle of 45° with a central axis of the pyramid prism and with a base face, said pyramid prism being mounted with said base face facing said second end of said electro-optic crystal and with each of said reflecting faces at an angle of substantially 45° to both the fast and slow axes of said electro-optic crystal, a first pair of opposite reflecting faces of said pyramid prism reflecting one of said two polarized light beams exiting the second end of said electro-optic crystal back into the second end of said electro-optic crystal parallel to said fourfold axis of rotary inversion and a second pair of opposite reflecting faces of said pyramid prism reflecting the other of said two polarized light beams exiting the second end of said electro-optic crystal back into said second end of said electro-optic crystal parallel to said fourfold axis of rotary inversion.

16. The apparatus of claim 15 wherein said four reflecting faces of said pyramid prism are coated with a metal selected to produce with said phase shifting means a total relative phase shift of approximately ¼ wave between the respective components of the two beams of polarized light.

17. The apparatus of claim 15 including means supporting said electro-optic crystal at said one end with said second end substantially unsupported, said pyramid prism being mounted on and supported by the second end of said electro-optic crystal.

18. The apparatus of claim 17 including an electrode member between said second end of said electro-optic crystal and said pyramid prism for applying said voltage to the second end of said electro-optic crystal, and at least a partial metal coating on said pyramid prism in electrical contact with said electrode member, and said flexible conductor connected to said electrode member through said metal coating on said pyramid prism.

19. The apparatus of claim 1 wherein said input means injects into said first end of said electro-optic crystal two beams of polarized light which are both polarized in planes at substantially 45° to said fast and slow axes of said electro-optic crystal and which each pass through said electro-optic crystal parallel to said fourfold axis of rotary inversion and exit at said second end of said electro-optic crystal, wherein said redirecting means comprises a four sided pyramid prism having four reflecting faces each making an angle of 45° with a central axis and with a base face, said pyramid prism mounted with said base face facing said second end of said electro-optic crystal and with each of said reflecting faces substantially parallel to one of said fast and slow axes of said crystal, a first pair of opposite reflecting faces of said pyramid prism reflecting one of said two polarized light beams exiting the second end of said electro-optic crystal back into the second end of the electro-optic crystal parallel to said fourfold axis of rotary inversion and with the plane of polarization at substantially 45° to both the fast and slow axes of the electro-optic crystal, and a second pair of opposite reflecting faces of said pyramid prism reflecting the other of said two polarized light beams exiting the second end of said electro-optic crystal back into the second end of said electro-optic crystal parallel to said fourfold axis of rotary inversion and with the plane of polarization at substantially 45° to both the fast and slow axes of the electro-optic crystal, said prism producing a relative phase shift between components of said two beams of polarized light parallel to said fast and slow axes of about ¼ wave, and wherein said conversion means converts the two beams of polarized light exiting said first end of said electro-optic crystal into said signal representative of the voltage between said two conducting objects.

20. The apparatus of claim 19 wherein said pyramid prism has an index of refraction of about 1.9 and wherein said reflecting faces of said pyramid prism are uncoated.

21. The apparatus of claim 19 wherein said reflecting faces are coated with a metal which with a selected index of refraction of the pyramid prism produces said relative phase shift of about ¼ wave between said components of said two beams of polarized light parallel to said fast and slow axes.

22. The apparatus of claim 19 including means supporting said electro-optic crystal from said one first with said second end being substantially unsupported, and wherein said pyramid prism is mounted on and supported by the second end of said electro-optic crystal.

23. The apparatus of claim 2 wherein said one end of said electro-optic crystal is said first end, said other end of said electro-optic crystal is said second end and said one conducting object is said second conducting object.

24. The apparatus of claim 10 wherein said one end of said electro-optic crystal is said first end, and said other end of said electro-optic crystal is said second end.

* * * * *